(12) United States Patent
Doundakov et al.

(10) Patent No.: US 6,249,404 B1
(45) Date of Patent: Jun. 19, 2001

(54) HEAD GIMBAL ASSEMBLY WITH A FLEXIBLE PRINTED CIRCUIT HAVING A SERPENTINE SUBSTRATE

(75) Inventors: Viktor S. Doundakov, San Jose; Kenneth F. Young, Sunnyvale, both of CA (US)

(73) Assignee: Read-Rite Corporation, Fremont, CA (US)

(*) Notice: Subject to any disclaimer, the term of this patent is extended or adjusted under 35 U.S.C. 154(b) by 0 days.

(21) Appl. No.: 09/246,184

(22) Filed: Feb. 4, 1999

(51) Int. Cl.[7] ................ G11B 5/48; G11B 5/56
(52) U.S. Cl. ................ 360/245.4; 360/294.3
(58) Field of Search ............... 360/245.4, 244.1, 360/240, 244.3, 294.3, 245.8

(56) References Cited

U.S. PATENT DOCUMENTS

| | | |
|---|---|---|
| 4,645,280 | 2/1987 | Gordon et al. . |
| 4,761,699 | 8/1988 | Ainslie et al. . |
| 4,819,094 | 4/1989 | Oberg . |
| 4,996,623 | 2/1991 | Erpelding et al. . |
| 5,055,969 | 10/1991 | Putnam . |
| 5,124,864 | 6/1992 | Matsuzaki . |
| 5,185,683 | 2/1993 | Oberg et al. . |
| 5,491,597 | 2/1996 | Benin et al. . |
| 5,528,819 | 6/1996 | McKay et al. . |
| 5,597,496 | 1/1997 | Masaichi et al. . |
| 5,598,307 | 1/1997 | Bennin . |
| 5,606,477 | 2/1997 | Erpelding et al. . |
| 5,687,479 | 11/1997 | Bennin et al. . |
| 5,734,523 | 3/1998 | Scheidecker et al. . |
| 5,805,382 | * 9/1998 | Lee et al. ............ 360/245.8 |
| 5,959,808 | * 9/1999 | Fan et al. ............ 360/294.3 |

* cited by examiner

*Primary Examiner*—Allen T. Cao
(74) *Attorney, Agent, or Firm*—Samuel A. Kassatly

(57) ABSTRACT

A head gimbal assembly includes a suspension of the type supporting a slider and a flex circuit. The suspension is formed of a load beam that supports the flex circuit, and a resilient flexure which is secured to the load beam and which supports the slider. The flex circuit is comprised of conductive traces formed on a compliant, dielectric substrate. The substrate includes a body portion and a head portion for supporting the conductive traces. The substrate head portion is patterned such that selected portions are removed to leave bare conductive trace sections on a generally serpentine insulation layer, in order to compensate for variations effected by heat and humidity. The serpentine insulation layer is S-shaped with a periodic pattern, and overlays but does not touch the load beam tip. The substrate body portion overlays and is secured to the load beam at selected locations. This design enables the flex circuit to provide support for the conductive traces, to insulate the conductive traces from the load beam, to minimize the stiffness effect of the flex circuit on the gimbal, to direct the expansion and contraction of the substrate in a controlled fashion while retaining the mechanical connectivity of traces to the substrate, and to minimize the effect of the expansion and contraction on the slider flying characteristics.

18 Claims, 11 Drawing Sheets

HEAD GIMBAL ASSEMBLY WITH A FLEXIBLE PRINTED CIRCUIT HAVING A SERPENTINE SUBSTRATE

BACKGROUND OF THE INVENTION

1. Field of the Invention

The present invention relates to disk drives and particularly to a flex circuit design for a flex on suspension (FOS) head gimbal assembly (HGA). The present invention achieves reduced pitch and roll stiffness by patterning an insulator substrate of the FOS to selectively leave bare conductive trace sections. More particularly, the invention concerns a method for improving the mechanical static and dynamic behaviors of the HGA.

2. Description of Related Art

In a conventional disk drive, a read/write head is secured to a rotary actuator magnet and a voice coil assembly by means of a suspension and an actuator arm, and is positioned over a surface of a data storage disk. In operation, a lift force is generated by the aerodynamic interaction between the head and the disk. The lift force is opposed by a counteracting spring force applied by the suspension, such that a predetermined flying height is maintained over a full radial stroke of the rotary actuator assembly above the surface of the disk.

The suspension includes a load beam and a flexure secured to a cantilevered end of the load beam. A slider is mounted to the flexure. The flexure provides a proper pivotal connection for the slider so that during operation, the slider can compensate for irregularities in the disk drive manufacture and operation, by pitching and/or rolling slightly in order to maintain the air bearing, while maintaining appropriate stiffness against yaw movement. Roll is defined as the rotation about an axis extending directly out from the actuator arm through the pivot connection point and parallel to the X-Y plane of the disk. Pitch is defined as rotation about an axis perpendicular to the roll axis through the pivot contact point and parallel to the X-Y plane of the disk. Yaw is gyration around an axis perpendicular to the air-bearing surface. The flexure has to achieve low enough pitch and roll stiffness for the air bearing flying height tolerances while at the same time achieving high enough yaw stiffness for track seeking. A dimple extends from either the load beam or the flexure tongue, to provide a point load about which the slider gimbals.

As with wires or other types of electrical interconnects, flex on suspensions (FOS) tend to increase the static pitch and roll angle variations, the gimbal stiffness and the gimbal stiffness variation of the HGA suspension. This results in increased flying height variability of the suspended slider.

Several head designs have been proposed to minimize the stiffness of the FOS circuit, so that the air bearing can more easily overcome the pitch and roll variations of the head. Other head designs have been proposed to reduce pitch and roll changes due to thermal and humidity induced swelling or shrinking of the polyimide or insulator layer of the FOS.

The following references illustrate various head designs employing flex circuits or insulating layers and conductive traces:

U.S. Pat. No. 4,645,280 to Gordon et al.;
U.S. Pat. No. 4,761,699 to Ainslie et al.;
U.S. Pat. No. 4,819,094 to Oberg;
U.S. Pat. No. 4,996,623 to Erpelding et al.;
U.S. Pat. No. 5,055,969 to Putnam;
U.S. Pat. No. 5,124,864 to Matsuzaki;
U.S. Pat. No. 5,185,683 to Oberg et al.;
U.S. Pat. No. 5,491,597 to Benin et al.;
U.S. Pat. No. 5,528,819 to McKay et al.;
U.S. Pat. No. 5,597,496 to Massaichi et al.;
U.S. Pat. No. 5,598,307 to Bennin;
U.S. Pat. No. 5,606,477 to Erpelding et al.;
U.S. Pat. No. 5,687,479 to Bennin et al.; and
U.S. Pat. No. 5,734,523 to Scheidecker et al.

U.S. Pat. No. 5,598,307 to Bennin, supra, is an exemplary reference, and describes laminate structures for use in head suspension assemblies. The laminate structures are intended to eliminate manual handling of conductors by integrating the manufacture of the interconnect assembly with that of the suspension assembly. The first step in the manufacture of the laminate structures is to provide a multi-layer laminate sheet. The sheet comprises a first layer of a metal spring material, an intermediate second layer of an electrically insulating, adhesive material, and a third layer of an electrically conductive material. The second step is to create the layers, starting from the outside in.

The first layer is etched to become the primary spring element. The third layer is etched to provide at least one trace, the trace including at least one elongated conductor configured for electrical coupling to a head assembly and for operation as an additional mechanical spring element in selected regions. The second layer provides panels shaped in conformance with the areas of contact between the structure remaining after the etching to produce the elements of the first and the third layers. The traces of the laminate structure are electrically coupled to a head assembly and the laminate structure is attached to other elements of the head stack assembly. The design includes sections wherein the first and second layers are etched away, leaving the traces of the third layer to serve as both the electrical conductors and the gimbal or flexure.

The laminate structures include interconnect assemblies, interconnect-suspension assemblies, and gimbal-interconnect assemblies. Interconnect assemblies attach to a load beam and include at least one conductive trace. The second layer provides dielectric insulation and the third layer can include support and stiffening plates. An interconnect-suspension assembly embodiment has a first layer of stainless steel, a thin second layer of polyimide, and a third layer of copper solder mask may be deposited over the copper traces. Gold may be deposited on the copper traces where there is no solder mask.

U.S. Pat. No. 5,055,969 to Putnam, supra, is another exemplary reference, and describes a flexible circuit for an actuator arm of a hard disk storage device. The flexible circuit has a servo preamplifier, a data preamplifier, a signal routing layer which includes a first ground plane, and an electrically conductive second ground plane which is electrically isolated from and closely spaced to the signal routing layer. The flexible circuit includes a flexible substrate which bends so that the actuator arm remains electrically connected to the servo controller and data read/write circuitry when the actuator arm moves the heads from track to track on the disk surfaces. The flexible substrate is multilayered and is formed of a plurality of electrically insulating and conducting layers. The conducting layers include a signal routing layer with a first ground plane which underlies the data and servo preamplifiers and a second electrically floating ground plane layer.

The signal routing layer contains a plurality of data lines which route data between the data head and the data preamplifier and between the data preamplifier and the tail portion. The conductive servo lines are also routed on the signal routing layer. The conductive servo lines route servo data between the servo head and the servo preamplifier and between the servo preamplifier and the tail portion. A conductive, electrically floating second ground plane is incorporated into a layer beneath the signal routing layer. An electrically insulating layer separates the signal routing layer from the second ground plane.

However, there is still a need for a flex circuit design HGA that achieves reduced pitch and roll stiffness, and that improves the mechanical static and dynamic behaviors of the HGA.

SUMMARY OF THE INVENTION

A feature of the present invention is to provide a new flex circuit design for use in a head gimbal assembly, for achieving reduced pitch and roll stiffness by patterning an insulator substrate of the FOS, and by selectively leaving bare conductive trace sections.

Another feature of the present invention is to minimize the head pitch and roll changes resulting from thermal and humidity induced swelling or shrinking.

The foregoing and other features and advantages of the present invention can be achieved by a new head gimbal assembly design. The head gimbal assembly includes a suspension of the type supporting a slider and a flex circuit. The suspension is formed of a load beam that supports the flex circuit, and a resilient flexure which is secured to the load beam and which supports the slider. The flex circuit is comprised of conductive traces formed on a compliant, dielectric substrate. The substrate includes a body portion and a head portion for supporting the conductive traces.

The substrate head portion is patterned such that selected parts of the head portion are removed to leave bare conductive trace sections. The bare conductive trace sections are located on a generally serpentine insulation layer, which compensates for variations effected by heat and humidity, and achieves reduced pitch and roll stiffness of the combined flexure and flex circuit. The serpentine insulation layer is S-shaped with a periodic pattern, and overlays but does not touch the load beam tip. The substrate body portion overlays and is secured to the load beam at selected locations.

This design enables the flex circuit to provide support for the conductive traces, to insulate the conductive traces from the load beam, to minimize the stiffness effect of the flex circuit on the gimbal, to direct the expansion and contraction of the substrate in a controlled fashion while retaining the mechanical connectivity of traces to the substrate, and to minimize the effect of the expansion and contraction on the slider flying characteristics.

BRIEF DESCRIPTION OF THE DRAWINGS

The features of the present invention and the manner of attaining them, will become apparent, and the invention itself will be understood by reference to the following description and the accompanying drawings, wherein.

Similar numerals in the drawings refer to similar or identical elements. It should be understood that the sizes of the different components in the figures might not be in exact proportion, and are shown for visual clarity and for the purpose of explanation.

DETAILED DESCRIPTION OF THE PREFERRED EMBODIMENTS

Figure 1:
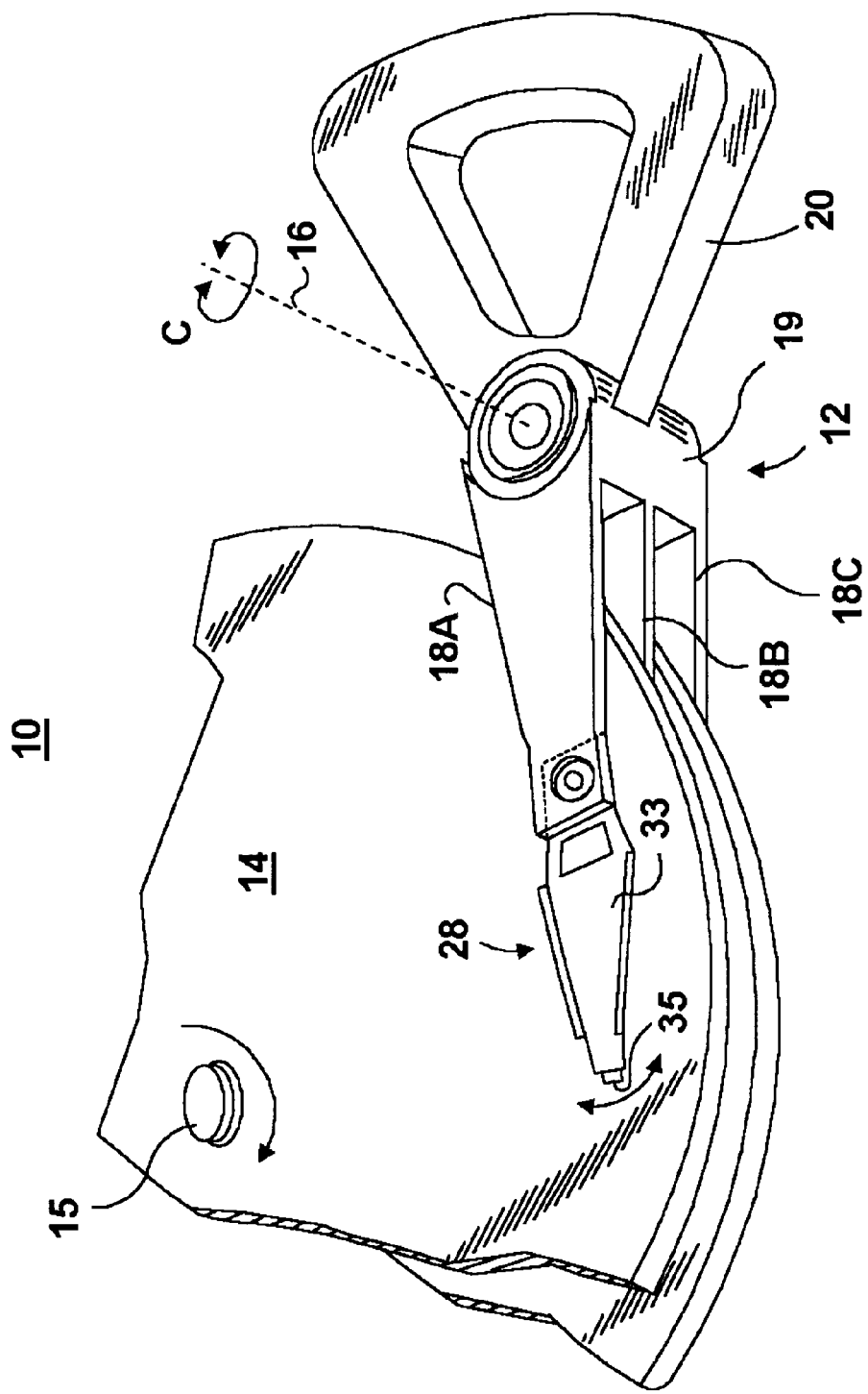
FIG. 1 is a fragmentary isometric view of a data storage system utilizing a head gimbal assembly (HGA) according to the present invention.

FIG. 1 illustrates a disk drive 10 comprised of a head stack assembly 12 and a stack of spaced apart magnetic data storage disks or media 14 that are rotatable about a common shaft 15. The head stack assembly 12 is rotatable about an actuator axis 16 in the direction of the arrow C. The head stack assembly 12 includes a number of actuator arms, only three of which 18A, 18B, 18C are illustrated, which extend into spacings above and below the disks 14.

The head stack assembly 12 further includes an E-shaped block 19 and a magnetic voice coil (or rotor) 20 attached to the block 19 in a position diametrically opposite to the actuator arms 18A, 18B, 18C. A voice coil 20 cooperates with a stator (not shown) for rotating in an arc about the actuator axis 16. Energizing the voice coil 20 with a direct current in one polarity or the reverse polarity causes the head stack assembly 12, including the actuator arms 18A, 18B, 18C, to rotate about the actuator axis 16, in a direction substantially radial to the disks 14.

Figure 2:
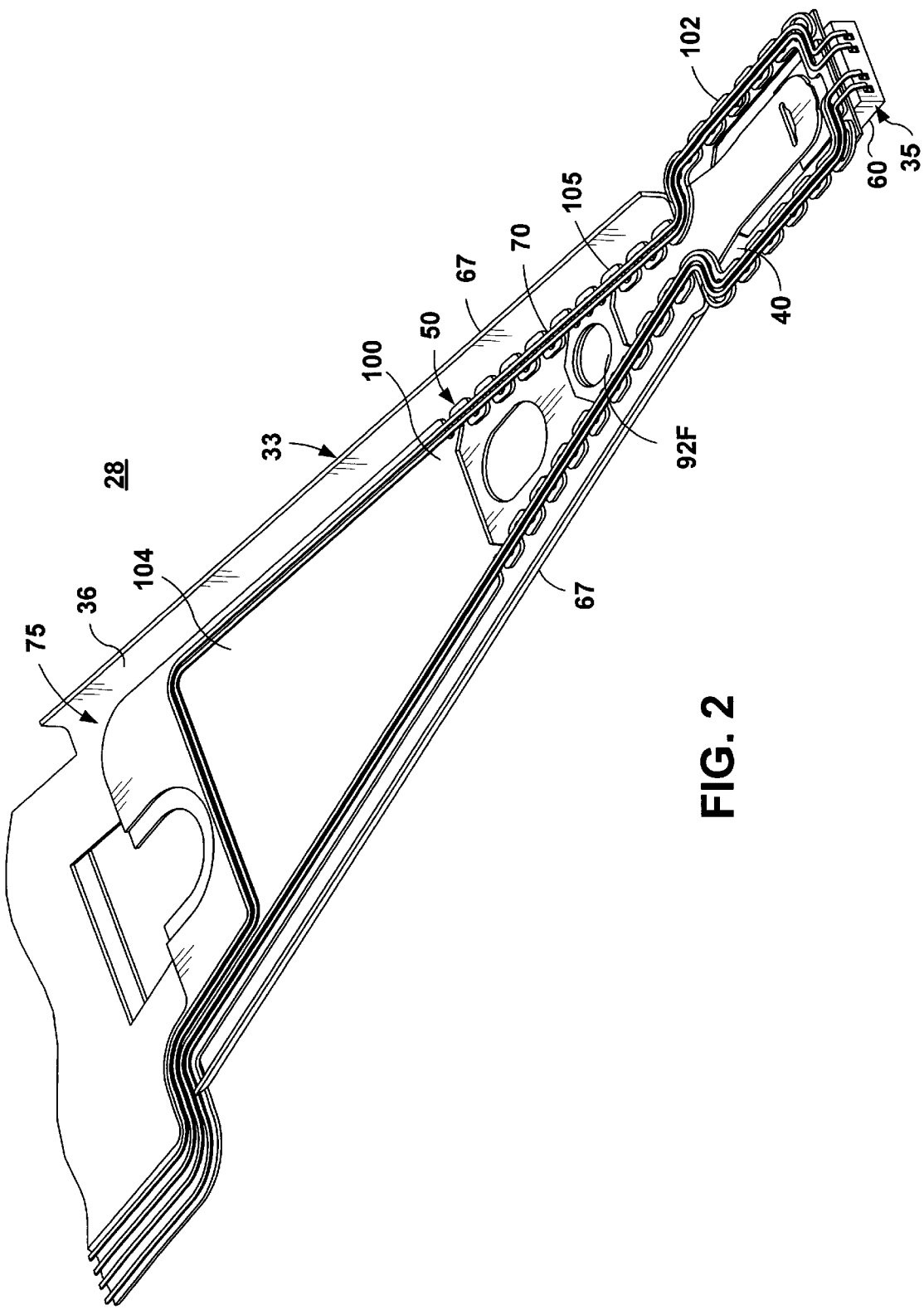
FIG. 2 is a perspective view of the HGA of FIG. 1, comprised of a load beam, a flexure, a flex on suspension (FOS), and a slider.
Figure 3:
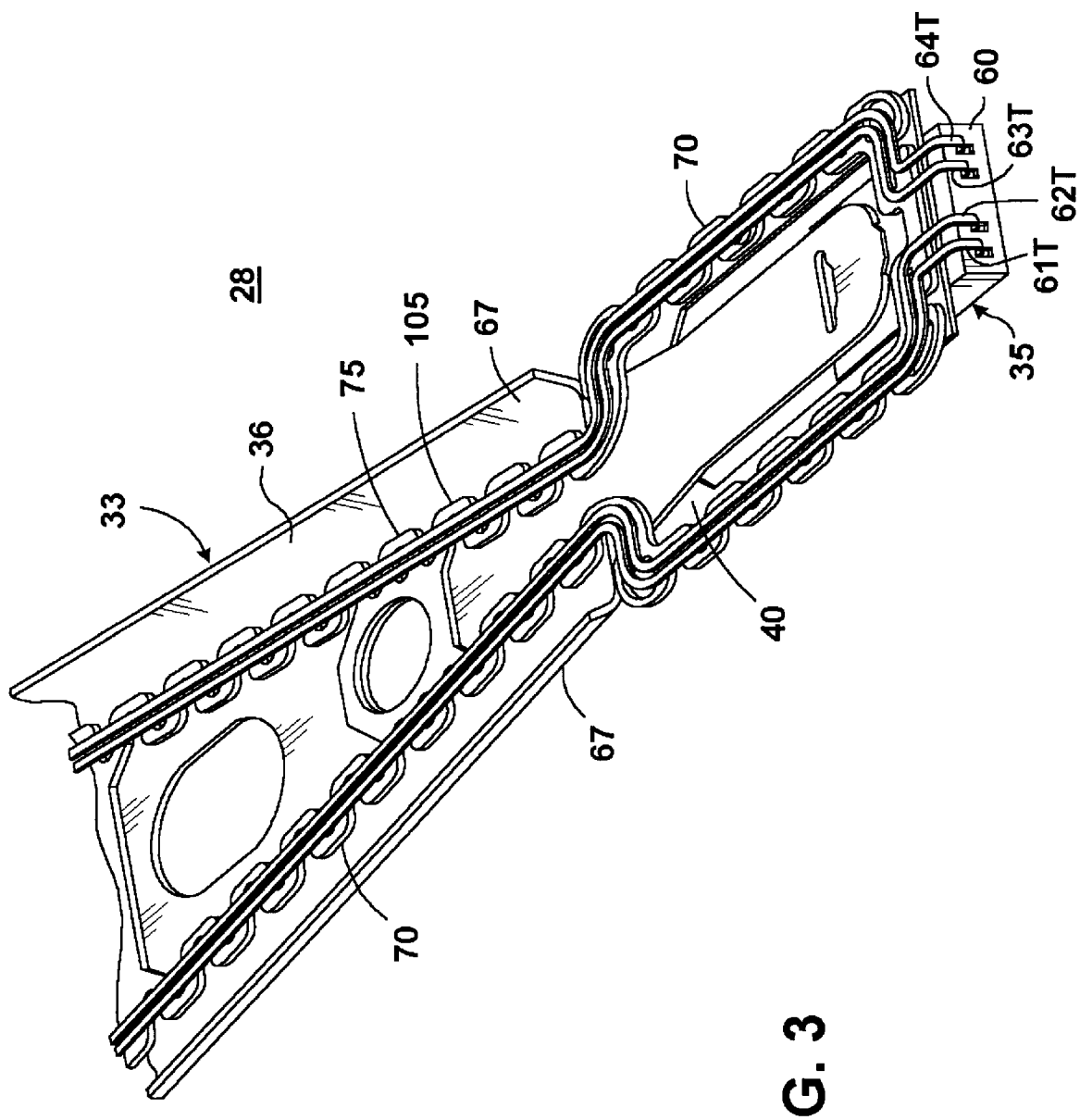
FIG. 3 is an enlarged, partial, isometric view of the HGA of FIG. 2.
Figure 4:
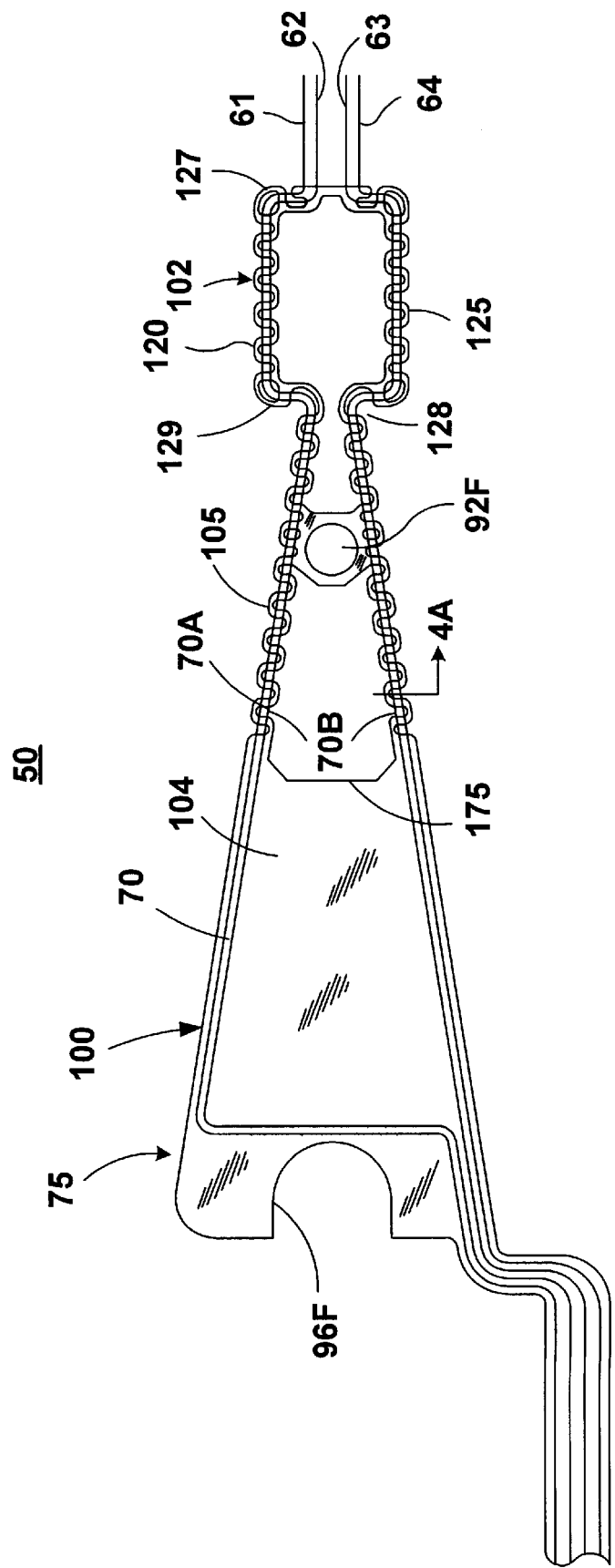
FIG. 4 is a top plan view of the FOS of FIGS. 2 and 3.

A head gimbal assembly (HGA) 28 is secured to each of the outer actuator arms, for instance 18A and 18C. A pair of HGA's 28 is secured to each inner actuator arm, for instance 18B. With further reference to FIGS. 2 and 3, the HGA 28 is comprised of a suspension (also referred to herein as a suspension assembly) 33 and a read/write head 35. The suspension 33 includes a load beam 36 and a flexure 40 to which the head 35 is secured. The HGA 28 further includes a flex circuit which is also referred to herein as a flex circuit on suspension (FOS) 50, and which is illustrated in additional detail in FIGS. 4 and 5.

Figure 7:
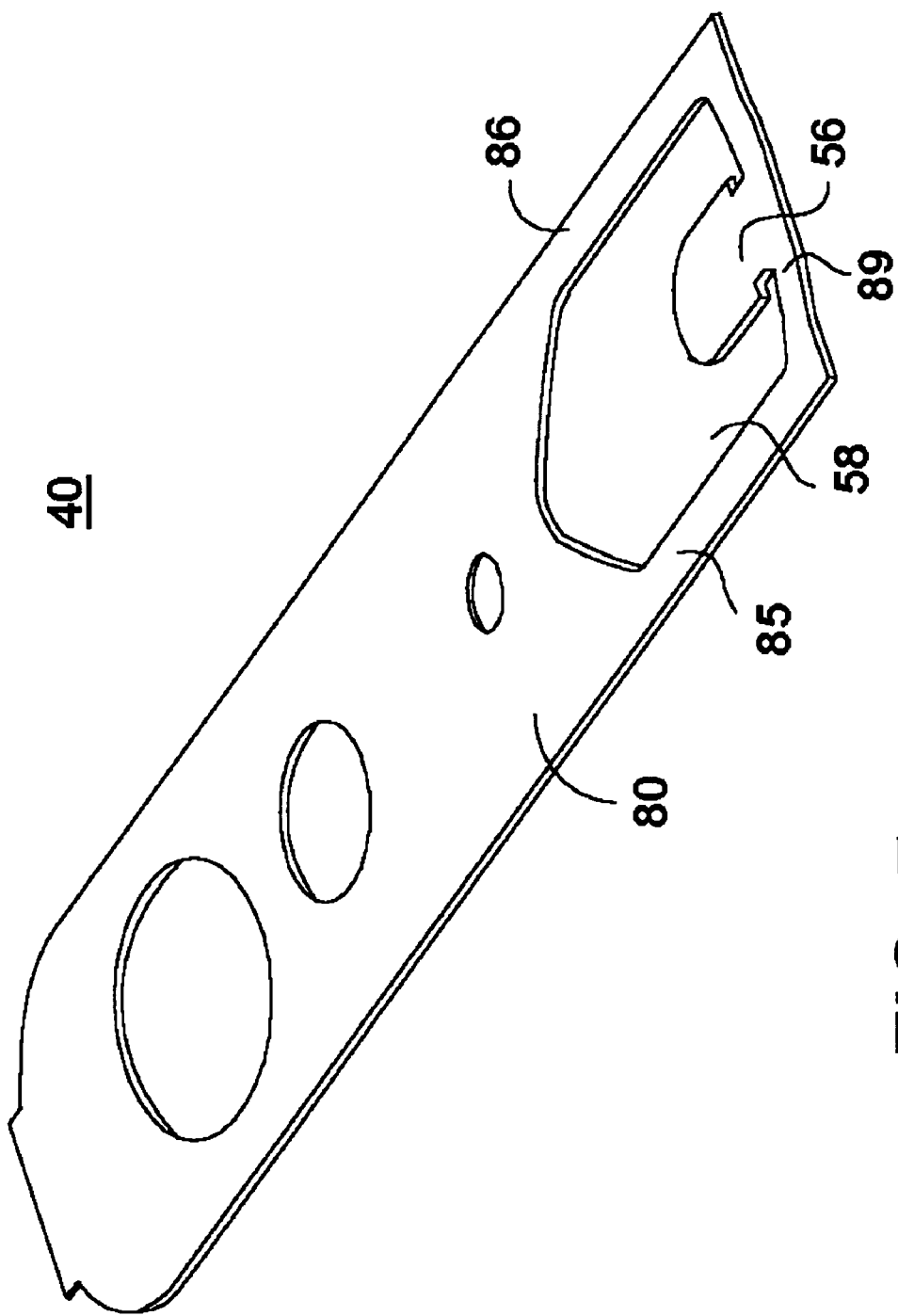
FIG. 7 is an isometric view of a flexure forming part of the HGA of FIGS. 2 and 3.
Figure 9:
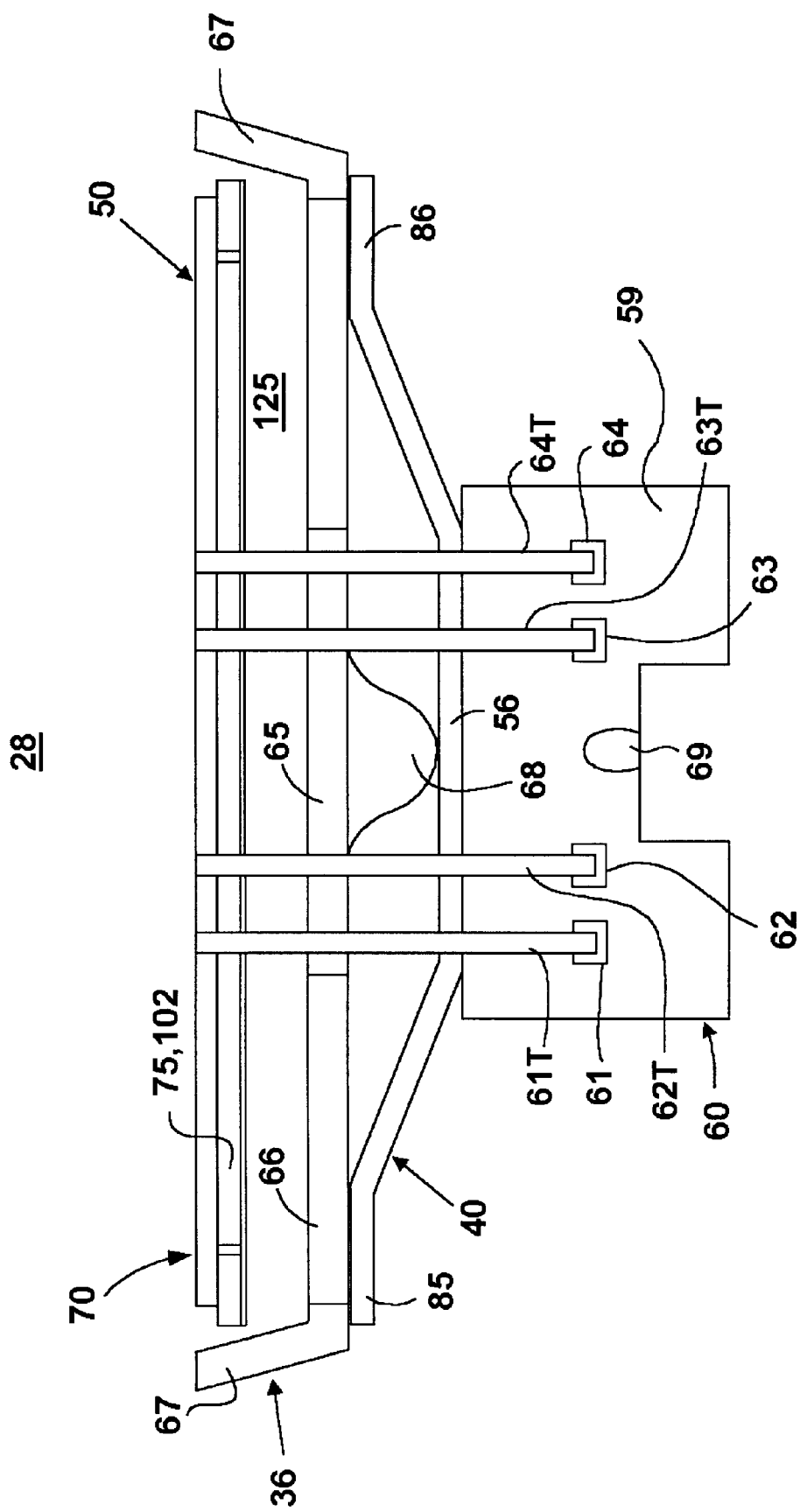
FIG. 9 is a front elevational view of the HGA of FIG. 7.

With further reference to FIGS. 7 and 9, the flexure 40 includes a tongue 56 that extends inwardly, within a clearance 58. The clearance 58 is contoured by a flexure body 80, two oppositely disposed peripheral ribs or outriggers 85, 86, and a trailing edge 89. The flexure 40 provides a slider 60 with sufficient flexibility in various degrees of movement for accommodating the uneven topology of the disk surface and other components and drive assembly tolerances, while the slider 60 is flying over the disk 14. The flexure 40 is sufficiently stiff in a direction parallel to the disk plane, to resist physical deflection that may be caused by the rapid movement of the actuator arms 18A, 18B, 18C.

Figure 5:
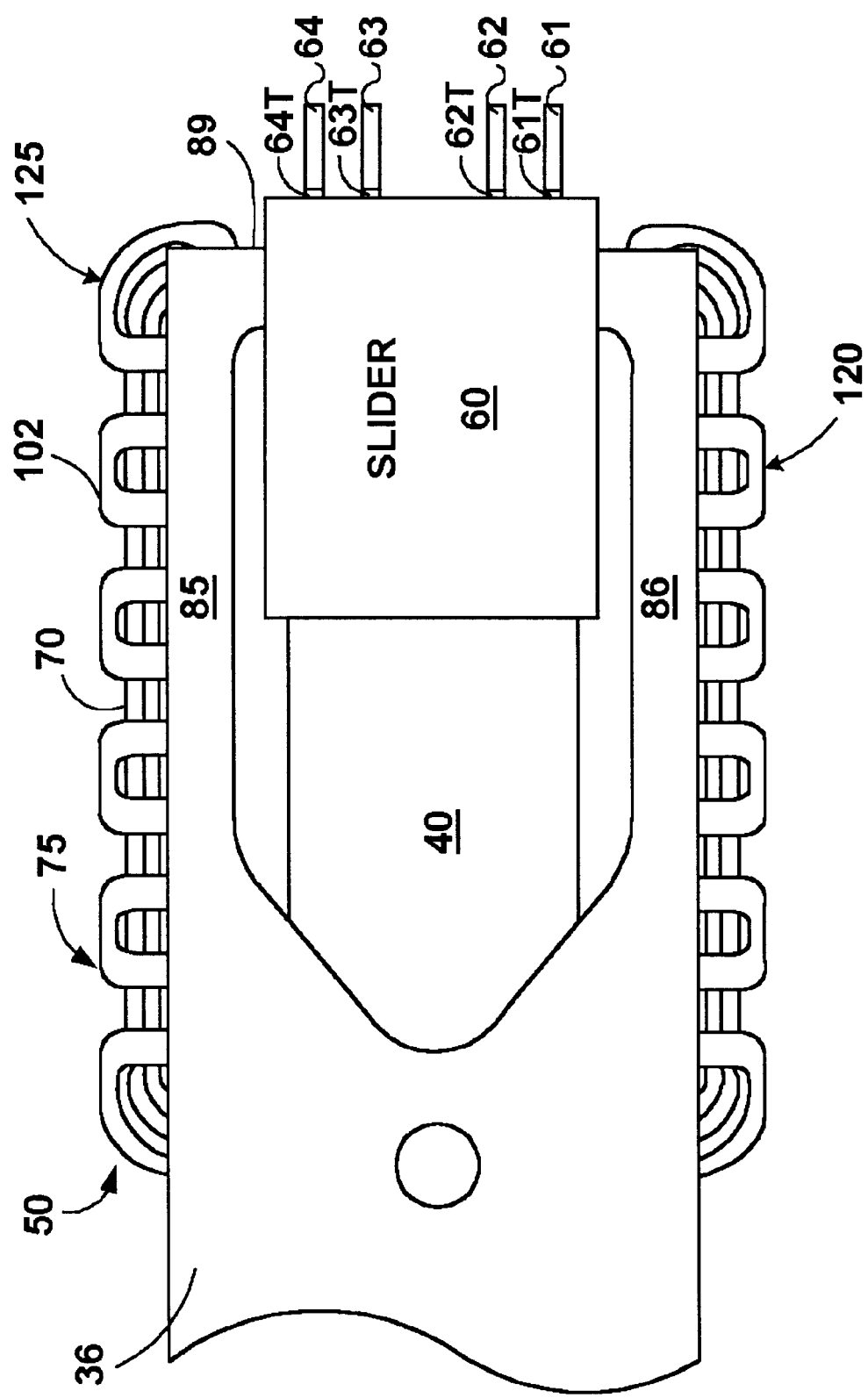
FIG. 5 is a greatly enlarged, partial, bottom plan view of the HGA of FIGS. 2 and 3.

The slider 60 forms part of the read-write head 35, and is secured to the tongue 56 by means of available techniques such as UV curable epoxy. A plurality of conductive contact pads, four of which 61, 62, 63, 64, are formed on the trailing side 59 of the slider 60, and are shown in FIGS. 5 and 9 for the purpose of illustration. These contact pads 61–64 are electrically connected to the FOS 50 by means of corresponding conductive traces 61T, 62T, 63T, and 64T for connection to a read and write element 69 (FIG. 9).

Figure 8:
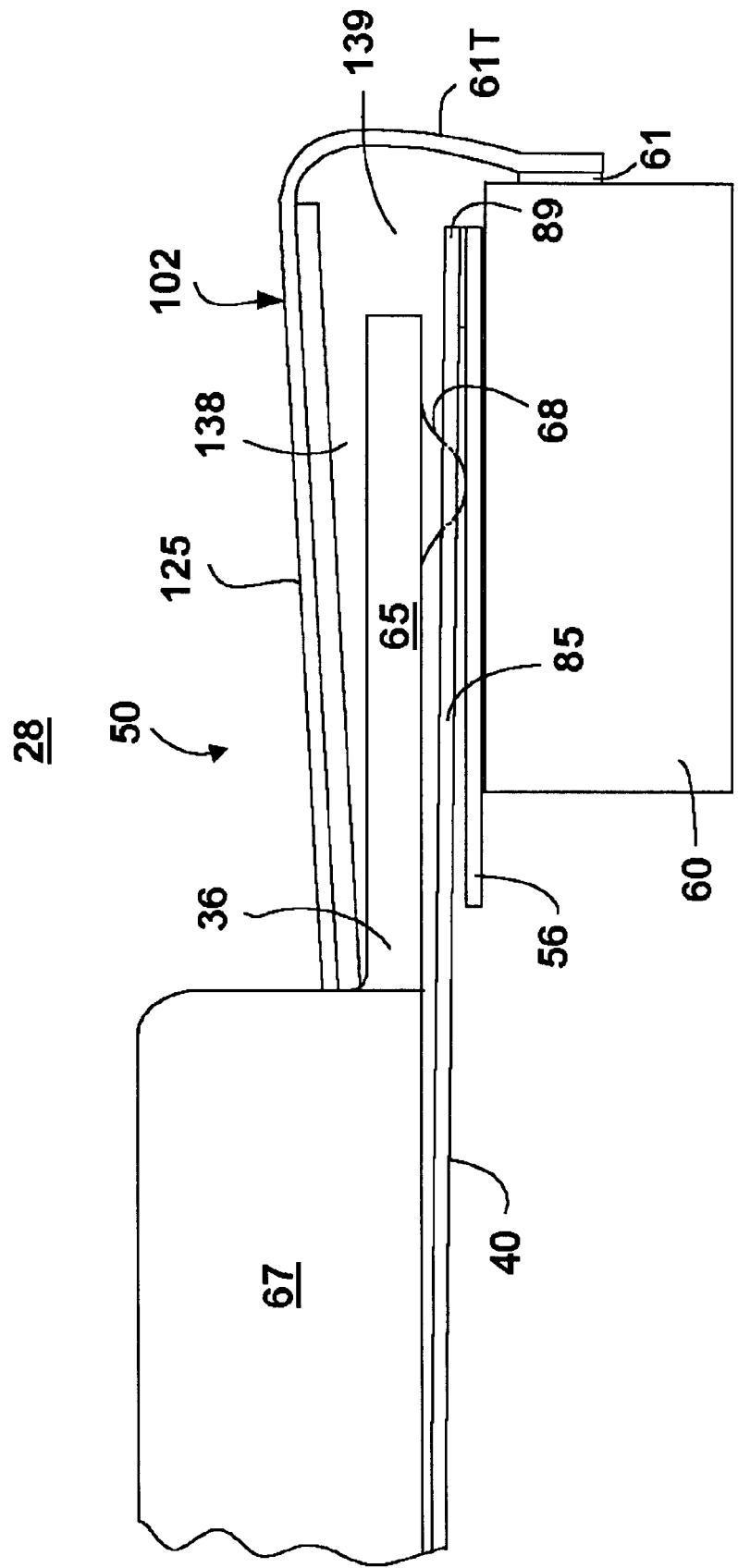
FIG. 8 is an enlarged, partial, fragmentary, side elevational view of the HGA of FIGS. 2 and 3.

With reference to FIGS. 8 and 9, a dimple 68 is formed in the load beam 36, and is urged against the backside of the tongue 56, for contributing to the gimbaling action. Alternatively, the dimple 68 can be formed on the tongue 56, and urged against the underside of the load beam 36.

Figure 6:
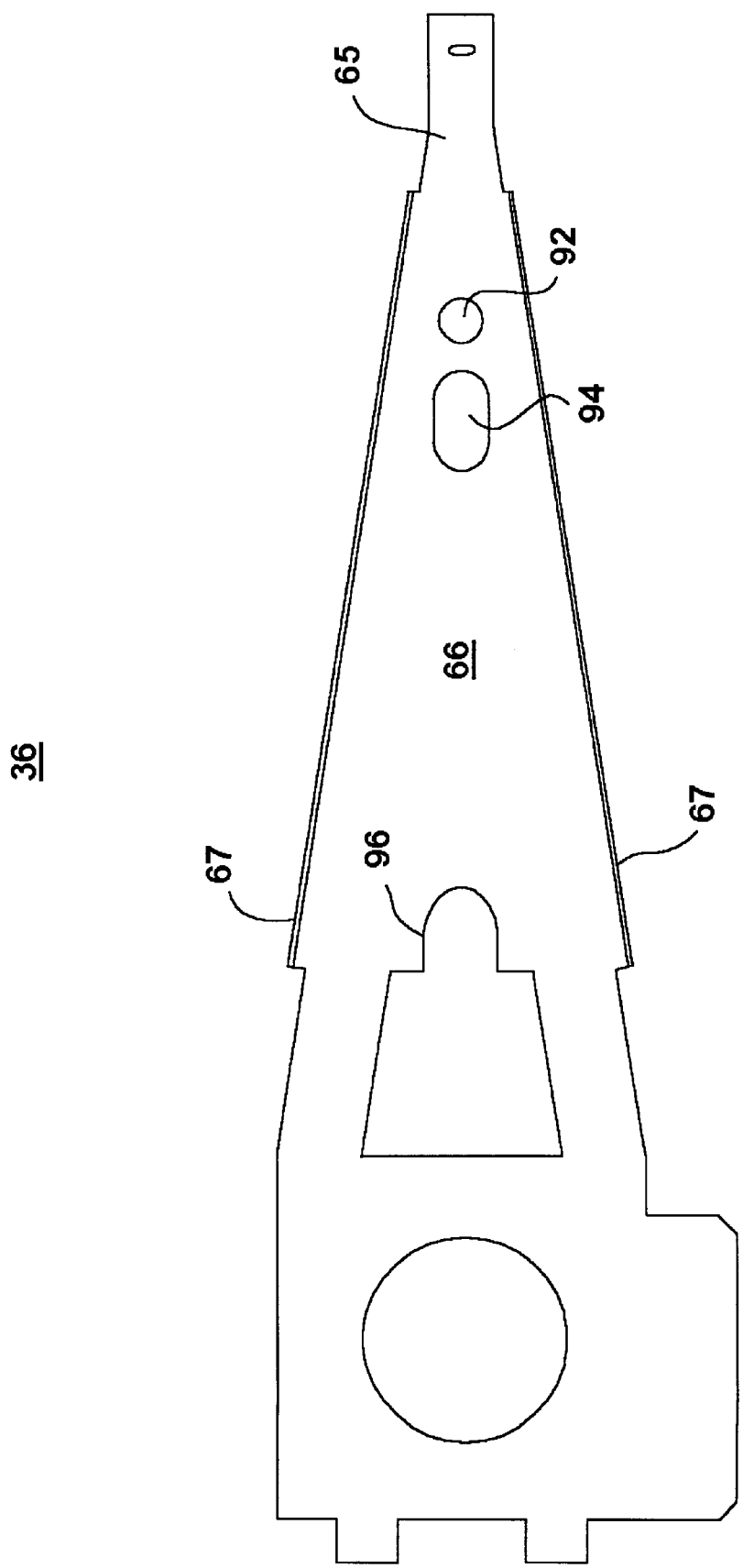
FIG. 6 is a top plan view of a load beam forming part of the HGA of FIGS. 2 and 3.

The load beam 36 includes a tip 65 which is positioned in proximity to peripheral ribs 85, 86 of the flexure 40, and above the flexure clearance 58 and at least part of the tongue 56. The tip 65 extends integrally in a body 66 having two stiffening rails 67 projecting along the length of the body 66. The body 66 includes datum features 92, 94, and 96 (FIG. 6), and the tip 65 includes the dimple 68.

Having described the general structure of the HGA 28, the FOS 50 will now be described in greater detail. Referring to the drawings and more particularly to FIGS. through 5, the FOS 50 is formed, for example, of a laminate comprised of conductive traces 70 that are formed on a patterned, compliant, substrate 75. The conductive traces 70 can be made primarily of conductive material, such as aluminum, steel, beryllium, gold, silver, but preferably from copper, due to the desirable conductivity and processing advantage of copper. The conductive traces 70, or selected portions thereof, can optionally be coated with a protective layer (not shown) to prevent them from shorting or corroding.

The substrate 75 is preferably a flat, patterned, flexible sheet of material adhered on one side to the conductive traces 70 by means of available techniques. The substrate 75 is made of plastic or polymeric resinous material, such as polyimide, and is attached to the conductive traces 70. The substrate 75 includes a body portion 100 and a patterned head portion 102.

The substrate body portion 100 overlays the load beam body 66 (FIG. 6), and is secured thereto at selected locations by means of available techniques such as adhesive bonding 107 (FIG. 4A) The substrate body portion 100 includes two datum holes or clearances 92F and 96F that coincide with the load beam datum features 92 and 96 respectively. Another datum hole (not shown) can optionally be added to the substrate body portion 100 to match and coincide with the load beam datum feature 94. The datum hole 92 can be used for mechanical registration, or can be enlarged for clearance of suspension registration pins, if other means of location, for example optical registration, are used.

The substrate body portion 100, is preferably, but optionally comprised of a non-patterned section 104 that extends in a patterned section 105. In a preferred embodiment, the patterned section 105 is serpentine, with a general S-Shape (or dollar shape) configuration. The patterned section 105 supports the conductive traces 70 at selected locations 70A (FIG. 4A), such that "bare" (i.e., unsupported) conductive traces 70B are not directly supported by the substrate 75. At locations 70A, these conductive traces 70 are supported by pads 108 (shown outlined in FIG. 4A by dotted lines for clarity of illustration), and define regions of connectivity between the traces 70 and the substrate 75, and that form part of the substrate patterned section 105. While these regions of connectivity will hereinafter be referred to as "pads", it should be clear that they are not necessarily isolated from one another. As a result, the unsupported conductive traces (or trace sections) 70B are interleaved between supported trace sections at locations 70B.

This design enables the FOS 50 to provide support for the conductive traces 70, to insulate the conductive traces 70 from the load beam 36, to minimize the stiffness effect of the FOS 50 on the gimbal, to direct the swelling (i.e., expansion) or shrinking (i.e., contraction) of the substrate 75 in a controlled fashion, while retaining the mechanical connectivity of traces 70 to the substrate 75, and to minimize the effect of the shrinking and swelling on the slider flying characteristics.

Preferably, in order to achieve the desired function of canceling or minimizing the shrinking or swelling effect of the substrate 75, alternate portions of the substrate 75 expand (or contract) in opposite directions so that they compensate for thermal or humidity caused variations.

In this particular illustration, the patterned section 105 extends about half way across the substrate body portion 100. It should however, be clear that the coverage of the substrate patterned section 105 can vary as required by the particular applications. The location of the attachment point or points of the substrate patterned section 105 (or the body portion 100) to the load beam 36 (that is where the patterned section 105 is glued to the load beam 36) can vary with several variables including but not limited to the substrate geometry.

The substrate 75 includes a dividing edge 175 (FIG. 4) that generally define the outline of the non-patterned section 104. If the dividing edge 175 were further back (that is closer to the datum hole 96F) the substrate 75 will exhibit a lower stiffness since a larger area of the substrate 75 will be allocated to the S-shaped patterned section 105 with reduced mass. Design considerations for the optimal placement of the dividing edge 175 include the fragility of the substrate 75 and its vibration (or dymanic) behavior.

The substrate head portion 102 overlays, and preferably does not touch the load beam (36) tip 65 (FIGS. 8, 9), in order to minimize the effect of the FOS 50 on the stiffness. Therefore, a clearance 138 (FIG. 8) is needed to prevent or substantially minimize the chances of substrate head portion 102 touching the tip 65 during normal operation conditions.

An important aspect of the present invention is the patterning of the substrate 75. According to one embodiment, selected portions of the substrate 75, including the substrate head portion 102, are removed such as by etching or other available techniques, leaving "bare" (or unsupported) conductive trace sections. In a preferred embodiment, and as is illustrated in FIGS. 4, 4A, 4B, and 5, the substrate head portion 102 is patterned in a serpentine (for example, S-shape or $-shape) configuration.

The patterning of the substrate 75 minimizes the head pitch and roll changes resulting from thermal and humidity induced swelling or shrinking, since the conductive traces 70 have lower thermal coefficients of expansion than the substrate 75 as well as lower moisture absorption than the substrate 75. The embodiment illustrated herein is only an example of leaving bare traces to reduce stiffness. Several other patterns can be used to reduce stiffness while providing adequate prevention from shorting and lending good manufacturing yields.

According to this exemplary embodiment, the substrate head portion 102 has a general rectangular outline, and is comprised of two lateral sides 120, 125, a trailing side 127, and two leading sides 128, 129. The present FOS 50 embodiment includes four conductors 61, 62, 63, 64 that overlay or are formed on, and secured to the substrate 75. It should be clear that the FOS 50 and particularly the substrate head portion 102 is not limited to the geometric shape(s) described herein, and that similar or equivalent shapes can alternatively be used.

The substrate head portion 102 overlays part of the outriggers 85, 86 (shown in dashed lines in FIG. 4B), without touching them, with the clearance 139 formed therebetween (FIG. 8). In the present exemplary embodiment, the substrate head portion 102 overlays the outer periphery of the outriggers 85, 86 and does not overlay the inner periphery 130 of the outriggers 85, 86.

Each of the leading sides 128, 129 of the substrate head portion 102 (for example 128) extends between two corner bends 143, 144. These substrate corner bends 143, 144 (FIG. 4B) are generally similar in structure and design, and are patterned, so as to provide protection to the traces from handling or electrical shorting. For example, the substrate 75 at the outer corner bend 143 is etched in such a way as to support the conductive trace 70 at two locations 70A, leaving the conductive trace 70 unsupported (i.e., bare or not directly supported) at location 70C. As a result, the outside sections of the corner bend 143 protect the traces.

Similarly, the substrate 75 at the inner corner bend 144 is etched is such a way as to support the conductive trace 70 at two locations 70A, leaving the conductive trace 70 unsupported at location 70D. As a result, the pattern provides maximum flexibility at the corner bends 144. The removal of the dielectric substrate at the corner bends 143, 144 reduces the pitch and roll stiffness of the FOS 50 at these locations.

Figure 4A:
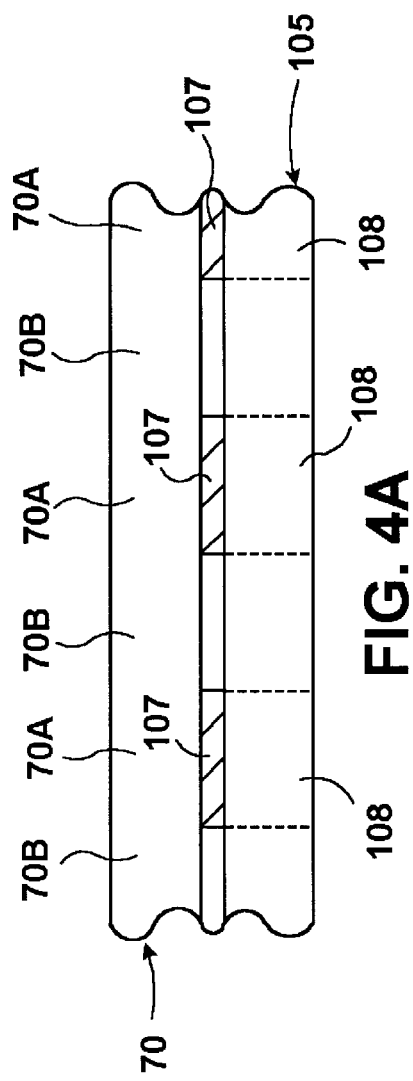
FIG. 4A is a greatly enlarged, fragmentary, side elevational view of the FOS shown in FIG. 4, taken along line 4A.
Figure 4B:
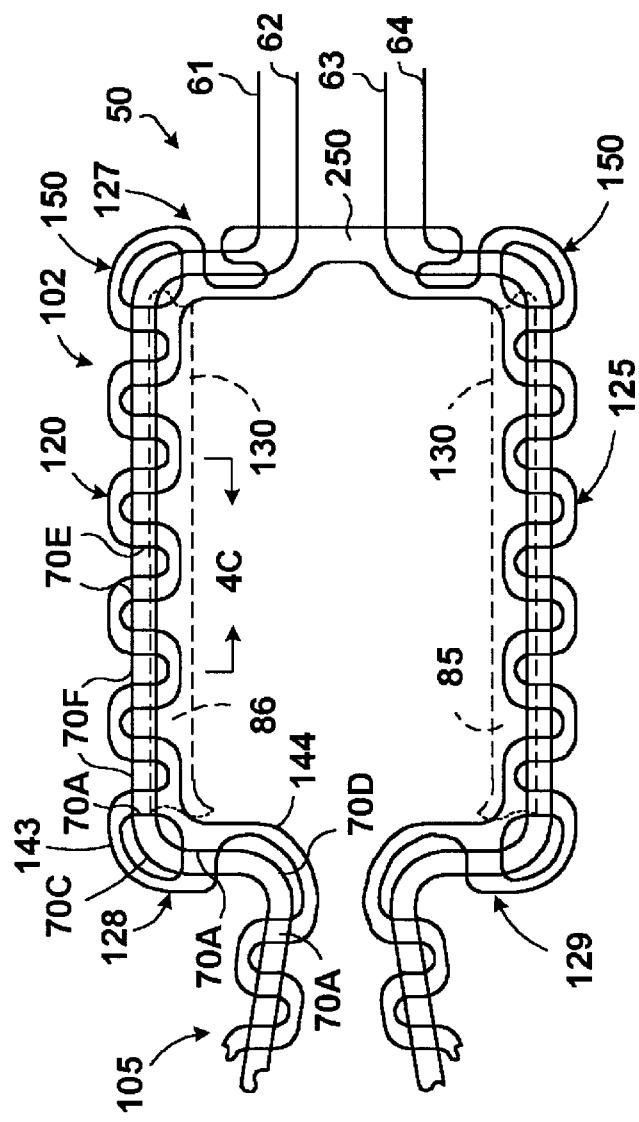
FIG. 4B is a fragmentary, enlarged, top plan view of a patterned substrate head portion forming part of the FOS of FIG. 4.

The two lateral sides 120, 125 of the substrate head portion 102 are generally similar in structure and design, and therefore only one lateral side 120 will be described herein in greater detail. The lateral side 120 extends between two generally similar corner bends, 128, 150. In a preferred embodiment, the substrate lateral side 120 is patterned in a generally serpentine (e.g. S-Shape, or $-shape) configuration. The substrate lateral side 120 supports the conductive traces 70 at selected locations 70E (FIG. 4B), such that "bare" (i.e., unsupported) conductive traces 70 are not directly supported by the substrate lateral side 120. At locations 70E, the conductive traces 70 are supported by separate pads similar to pads 108 (FIG. 4A). As a result, the unsupported conductive traces (or trace sections) 70F are interleaved between supported trace sections at locations 70E.

Figure 4C:
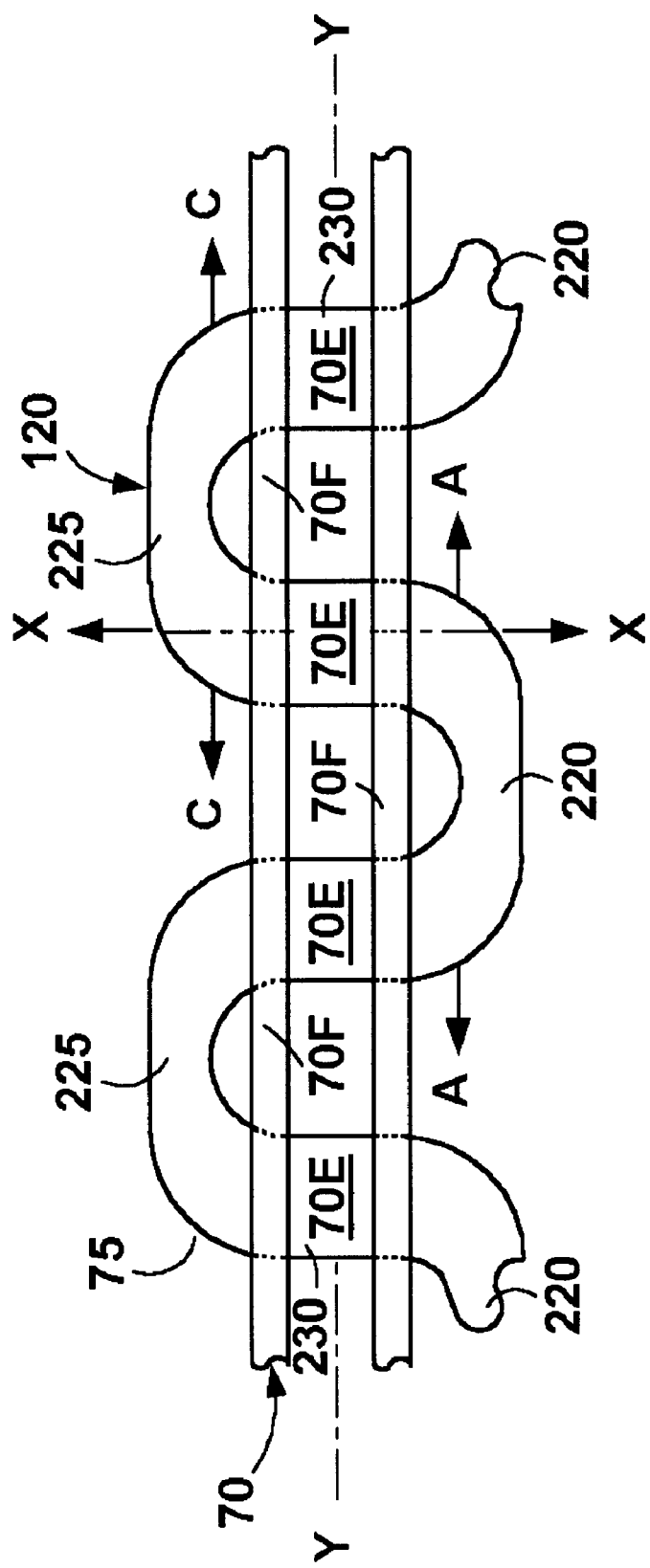
FIG. 4C is a greatly enlarged, fragmentary, top plan view of a lateral side of the substrate head portion of FIG. 4B, taken along line 4C.

With reference to FIG. 4C, the special pattern of the polyimide substrate lateral side 120 and the patterned section 105 of the body portion 100 reduces the overall mass of the HGA 28, and minimizes the effect of temperature and humidity variation on the FOS 50. Temperature variation (whether contraction or expansion) affects each of the multi-layers (or bi-layers as is in this example: the substrate 75 and the conductive trace 70), differently.

However, shaping the substrate 75 in a serpentine (or S) configuration, minimizes the relative thermal or hygroscopic variation between the multiple layers 75, 70 of different compositions, by canceling out the shrinking or swelling of the different sections of the serpentine, in effect compensating for the difference in the contraction and expansion of the layers 75, 70. Such cancellation or compensation is effected by redirecting the expansion or contraction direction of the polyimide substrate layer 75 in a desired direction, or away from an undesired direction, while retaining the structural robustness of the FOS 50.

The substrate lateral side 120 (FIG. 4C) has a periodic S-shape configuration, wherein inboard sections 220 are disposed on one side (i.e., the inner periphery of the substrate head portion 102), and extend generally parallel to a Y axis, that is substantially parallel to the conductive traces 70. Similarly, outboard sections 225 are disposed on the opposite side (i.e., the outer periphery of the substrate head portion 102), and extend generally parallel to the Y axis. The substrate lateral side 120 further includes lateral sections 230 that extend intermediate to the inboard sections 220 and the outboard sections 225, along an X axis, which is generally normal to the Y axis. The periodicity of the serpentine configuration is preferable for ease of manufacture. It should be clear that alternative, non-periodic configurations can be used.

In the event of a temperature variation, the contraction or expansion of the inboard sections 220 and the outboard sections 225 is substantially effected and limited to the Y axis direction, along the arrows A and C, respectively. Similarly, temperature and humidity variation effects contraction or expansion of the lateral sections 230 generally along the X axis. As a result of such well directed contraction or expansion, this design achieves the desired cancellation or compensation of variations effected by humidity, temperature, or other variables.

The substrate trailing side 127 is defined between two generally similar corner bends 150, that are similar in function and design to the corner bend 143. The substrate trailing side 127 includes a trailing support edge 250 that supports the four traces or leads 61, 62, 63, 64 and that provides support and robustness to the substrate 75. The trailing side 127 provides spacing between the conductive traces 61T, 62T, 63T, and 64T for ease of assembly.

In one embodiment, the substrate 75 has a generally uniform width of approximately around 2 mils along most of its length. However, such width can vary for example between approximately 0.5 mil and 10 mils. The width of the conductive traces 70 is generally uniform along substantially the entire length of the FOS 50, including the traces 61, 62, 63, 64 and ranges between approximately 0.5 mil and 5 mils.

It should be understood that the geometry, compositions, and dimensions of the elements described herein may be modified within the scope of the invention and are not intended to be the exclusive; rather, they can be modified within the scope of the invention. Other modifications may be made when implementing the invention for a particular environment.

What is claimed is:

1. A head gimbal assembly of the type supporting a slider and a flex circuit, comprising:

a load beam for supporting the flex circuit;

a flexure secured to said load beam and supporting the slider;

the flex circuit comprised of conductive traces formed on a compliant, dielectric substrate;

said substrate including a body portion and a head portion for supporting said conductive traces; and said substrate head portion being patterned wherein selected portions of said head portion are removed to leave bare conductive trace sections on a generally S-shaped insulation layer with a substantially periodic pattern, to compensate for variations effected by heat and humidity.

2. A head gimbal assembly according to claim 1, wherein said substrate body portion overlays and is secured to said load beam at one or more selected locations.

3. A head gimbal assembly according to claim 1, wherein said substrate body portion includes a non-patterned section that extends in a patterned section.

4. A head gimbal assembly according to claim 3, wherein said patterned section is serpentine, with a general S-Shape configuration.

5. A head gimbal assembly according to claim 4, wherein said patterned section supports said conductive traces at selected locations, and wherein bare conductive traces are not directly supported by said substrate.

6. A head gimbal assembly according to claim 5, wherein said conductive traces are selectively supported by pads that define regions of connectivity with said conductive traces.

7. A head gimbal assembly according to claim 5, wherein said patterned section extends about half way across said substrate body portion.

8. A head gimbal assembly according to claim 7, wherein said substrate includes a dividing edge at an intersection between said pattern section and said non-patterned section.

9. A head gimbal assembly according to claim 3, wherein said load beam includes a tip; and wherein said substrate head portion overlays but does not touch said load beam tip .

10. A head gimbal assembly according to claim 1, wherein the width of said conductive traces is generally uniform.

11. A head gimbal assembly according to claim 10, wherein the width of said conductive traces ranges between approximately 0.5 mil and 5 mils.

12. A head gimbal assembly according to claim 1, wherein said conductive traces include a bend region; and wherein said substrate head portion is patterned to remove substrate material from underneath said bend region.

13. A head gimbal assembly according to claim 12, wherein said conductive traces include four bend regions; and wherein said substrate head portion is patterned to remove substrate material from underneath a conductive trace of at least one of said bend regions.

14. A head gimbal assembly according to claim 1, wherein said conductive traces are made of any of or more of: aluminum, steel, beryllium, gold, silver, or copper; and wherein said substrate is made of any of: plastic or polymeric resinous material.

15. A head gimbal assembly according to claim 14, wherein said substrate is made of polyimide.

16. A head gimbal assembly according to claim 1, wherein said substrate body portion overlays a part of said load beam, and is secured thereto at selected locations.

17. A suspension assembly of the type supporting a slider, comprising:

a flex circuit;

a load beam for supporting said flex circuit;

a resilient flexure secured to said load beam and supporting the slider;

said flex circuit comprised of conductive traces formed on a compliant, dielectric substrate;

said substrate including a body portion and a head portion for insulating and supporting said conductive traces; and said substrate head portion being patterned wherein selected portions of said head portion are removed to leave bare conductive trace sections on a generally S-shaped insulation layer with a substantially periodic pattern, to compensate for variations effected by heat and humidity.

18. A suspension assembly of the type supporting a slider, comprising:

a flex circuit;

a load beam for supporting said flex circuit;

a resilient flexure secured to said load beam and supporting the slider;

said flex circuit comprised of conductive traces formed on a compliant, dielectric substrate;

said substrate including a body portion and a head portion for insulating and supporting said conductive traces; and said substrate head portion including a generally S-shaped insulation layer with a substantially periodic pattern, wherein selected portions of said head portion are removed to leave unsupported conductive trace sections that are generally interleaved with supported conductive trace sections, so that alternate portions of the substrate expand and contract in opposite directions to substantially compensate for thermal and humidity caused variations.

* * * * *